(12) United States Patent
Lu et al.

(10) Patent No.: US 9,760,978 B1
(45) Date of Patent: Sep. 12, 2017

(54) MISSING REGION PREDICTION

(71) Applicant: Adobe Systems Incorporated, San Jose, CA (US)

(72) Inventors: Xin Lu, Mountain View, CA (US); Zhe Lin, Fremont, CA (US); Jen-Chan Jeff Chien, Saratoga, CA (US)

(73) Assignee: Adobe Systems Incorporated, San Jose, CA (US)

( * ) Notice: Subject to any disclaimer, the term of this patent is extended or adjusted under 35 U.S.C. 154(b) by 0 days.

(21) Appl. No.: 15/149,415

(22) Filed: May 9, 2016

(51) Int. Cl.
| | |
|---|---|
| *G06T 5/00* | (2006.01) |
| *G06T 5/50* | (2006.01) |
| *G01R 33/56* | (2006.01) |
| *G06T 9/00* | (2006.01) |
| *H04N 1/60* | (2006.01) |

(52) U.S. Cl.
CPC .............. *G06T 5/001* (2013.01); *G01R 33/56* (2013.01); *G06T 5/006* (2013.01); *G06T 5/50* (2013.01); *G06T 9/002* (2013.01); *H04N 1/60* (2013.01); *G06T 2207/10016* (2013.01); *G06T 2207/20081* (2013.01); *G06T 2207/20084* (2013.01); *G06T 2207/20212* (2013.01)

(58) Field of Classification Search
CPC ........... G06T 5/001; G06T 5/006; G06T 5/50; G06T 2207/10016; G06T 2207/20081; G06T 2207/20084; G06T 9/002; G06T 2207/20212; H04N 1/60; G01R 33/56
See application file for complete search history.

(56) References Cited

U.S. PATENT DOCUMENTS

| | | | | |
|---|---|---|---|---|
| 4,809,349 A | * | 2/1989 | Herby | ..................... G06T 5/20 382/270 |
| 6,370,270 B1 | * | 4/2002 | Nair | ..................... G06K 9/6203 382/209 |
| 6,721,446 B1 | * | 4/2004 | Wilensky | ............... G06K 9/342 345/613 |
| 7,340,108 B2 | * | 3/2008 | Florent | ................... G06T 5/002 382/260 |
| 7,676,081 B2 | * | 3/2010 | Blake | ................. G06K 9/00234 358/538 |
| 7,729,422 B2 | * | 6/2010 | Wilensky | ............... G06T 7/194 375/240.01 |

(Continued)

OTHER PUBLICATIONS

Barnes,"PatchMatch: A Randomized Correspondence Algorithm for Structural Image Editing", ACM SIGGRAPH 2009 Papers (New Orleans, Louisiana, Aug. 3-7, 2009), Aug. 3, 2009, 10 pages.

(Continued)

*Primary Examiner* — Manav Seth
(74) *Attorney, Agent, or Firm* — Wolfe-SBMC (57) ABSTRACT

Missing region prediction techniques are described. In implementations, an image pair is obtained that includes first and second images. The first image is corrupted by removing a region of content, resulting in a corrupted image having a missing region. The corrupted image and the second image of the image pair are then used to generate a training-image pair. Then, based on a plurality of training-image pairs including the generated training-image pair, a model is trained using machine learning. The model can subsequently be used to predict pixel values of pixels within a subsequent missing region of a subsequent image that is not used as part of the training.

20 Claims, 8 Drawing Sheets

(56) References Cited

U.S. PATENT DOCUMENTS

| | | | | |
|---|---|---|---|---|
| 7,853,099 | B2* | 12/2010 | Shinmei | H04N 5/357 348/222.1 |
| 8,331,695 | B1* | 12/2012 | Delva | G06T 7/136 382/218 |
| 8,634,627 | B2* | 1/2014 | Fujisawa | A61B 6/032 128/922 |
| 8,698,906 | B2* | 4/2014 | Imade | G06T 3/4069 348/218.1 |
| 2004/0042662 | A1* | 3/2004 | Wilensky | G06K 9/342 382/194 |
| 2008/0267526 | A1 | 10/2008 | Mitsunaga et al. | |
| 2009/0161948 | A1* | 6/2009 | Takahashi | G06T 5/003 382/160 |
| 2010/0039556 | A1* | 2/2010 | Au | H04N 5/144 348/452 |
| 2012/0281923 | A1 | 11/2012 | Irani et al. | |
| 2012/0320228 | A1* | 12/2012 | Imade | G06T 3/4069 348/220.1 |
| 2013/0272602 | A1* | 10/2013 | He | G06T 5/001 382/164 |
| 2015/0294182 | A1* | 10/2015 | Kenig | G06T 5/50 382/132 |
| 2016/0063685 | A1* | 3/2016 | Tuzel | G06T 5/002 382/159 |

OTHER PUBLICATIONS

Chen, "Semantic Image Segmentation with Deep Convolutional Nets and Fully Connected CRFs", International Conference on Learning Representations (ICLR), Apr. 9, 2015, 14 pages.

Long, "Fully Convolutional Networks for Semantic Segmentation", IEEE Conference on Computer Vision and Pattern Recognition (CVPR), Nov. 14, 2014, 10 pages.

Noh, "Learning Deconvolution Network for Semantic Segmentation", International Conference on Computer Vision (ICCV), 2015., May 2015, pp. 1520-1528.

Simonyan, "Very deep convolutional networks for large-scale image recognition", In Journal of Computing Research Repository, Sep. 2014, 14 pages.

"Non-Final Office Action", U.S. Appl. No. 15/191,141, dated Jun. 15, 2017, 7 pages.

* cited by examiner

MISSING REGION PREDICTION

BACKGROUND

In some instance, images include regions with missing content, such as an area in the image where pixel values are incorrect, thereby creating a "hole" in the image. Conventional techniques used to predict content (e.g., color, texture, and so on) with which to fill the hole and restore the image generally generate an initial prediction of each pixel value in the hole by copying its nearest pixel value in the image, such as pixel values immediately surrounding the hole. These initial pixel values are then used for a similarity search within a larger search region in the image using a similarity search algorithm to refine the initial prediction.

These conventional techniques, however, can introduce visible errors and incorrect content in the hole based on the initial pixel values, particularly when the surrounding pixel values are non-uniform. This initiation error cannot be corrected using the conventional techniques. Because of these limitations, some holes cannot be filled appropriately and thus, some images cannot be restored correctly using conventional techniques.

SUMMARY

This Summary introduces features and concepts of missing region prediction, which are further described below in the Detailed Description and/or shown in the Figures. This Summary should not be considered to describe essential features of the claimed subject matter, nor used to determine or limit the scope of the claimed subject matter.

Missing region prediction techniques are described. In implementations, an image pair is obtained that includes first and second images. The first image is corrupted by removing a region of content (e.g., by setting pixel values within the region to zero), resulting in a corrupted image having a missing region. The corrupted image and the second image of the image pair are then used to generate a training-image pair. Based on a plurality of these training-image pairs, a model is trained using machine learning, e.g., through use of a neural network. The model can subsequently be used to predict pixel values of pixels within a subsequent missing region of a subsequent image that is not used as part of the training.

The techniques described herein extend existing content aware fill operations by providing better raw initialization values through deep neural network training. The raw initialization values for the missing region determine a quality of final content aware fill results. A key value of the raw initialization is providing the best guess of semantic content in the missing region, which can be used for finding patches of similar content in the image. By providing improved raw initialization values, content aware fill operations can thus provide improved results that are more accurate than conventional techniques.

BRIEF DESCRIPTION OF THE DRAWINGS

Implementations of missing region prediction are described with reference to the following Figures. Entities represented in the Figures may be indicative of one or more entities and thus reference may be made interchangeably to single or plural forms of the entities in the discussion. The same numbers may be used throughout to reference like features and components that are shown in the Figures.

DETAILED DESCRIPTION

Overview

Conventional techniques used to predict content for missing regions in images can be inefficient due to a variety of limitations. For instance, these conventional techniques utilize nearest pixel values surrounding the missing region for initial predictions of pixel values within the missing region, which cause introduction of visual errors and incorrect content into the missing region. This can occur most frequently when the missing region is surrounded by multiple objects or complex background scenes. Accordingly, because conventional techniques generally rely heavily on the initial predictions, the quality of performance of these conventional techniques directly depends on the quality of the initialization.

Accordingly, techniques are described in the following for missing region prediction that provide improved initialization, which enables improved and more accurate predictions of missing content. In one example, a model is trained using machine learning on pairs of original images and corrupted images. The corrupted images are corrupted versions of the original images through inclusion of a missing region, such as a region of pixels set to zero. Given a large collection of training data (e.g., image pairs), the model can be trained to identify content with which to fill in the missing region and restore the corrupted image to the original image. In implementations, the model is implemented using a fully convolutional neural network, which represents a structure describing a connection between the corrupted image and the original image in the image pair. The model encodes image semantics and structural information of the image, such as a location of the missing region and its nearby contents.

This model is particularly useful when the missing region is surrounded by non-uniform content, such as multiple objects or complex background scenes. Further, the model described herein produces a raw initialization that is usable to extend a content aware fill operation, such as a patch matching algorithm, to improve the quality of prediction results for content in the missing region.

In at least one implementation, a similarity learning and inference approach is used to identify visual similarities between a missing region in an image and remaining regions in the image. Using a neural network that is trained using machine learning on a large collection of images, the image with the missing region can be analyzed in its entirety to predict which part of the image outside of the missing region is likely to be similar to content within the missing region. This prediction provides an indicator as to which patch of content in the image is to be used to fill the missing region. In at least some implementations, the prediction is based on a distance map that is generated using the neural network, where the distance map describes similarities between the missing region and remaining regions in the image.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures. Finally, an example system and device are described that are operable to use the techniques and systems described herein in accordance with one or more implementations.

As used herein, the term "content" is representative of image data, such as color and texture. The content can include foreground objects, background scenery, patterns, objects that are the focus of an image, and so on. The content can represent a scene in a photograph captured by a camera, an object drawn by a user, and so on.

As used herein, the term "missing region" may refer to a region or area of an image that lacks content. Thus, the missing region may have "missing content", which is a lack of content that should be included in the image compared to remaining regions in the image that do include content. For example, a missing region may include pixels that are set to a uniform value (e.g., zero) such that the missing region is blank or greyed out in comparison to other regions in the image that have content (e.g., pixel color and texture). The missing region can also be referred to herein as a "hole" in the image.

As used herein the term "neural network" may refer to a computer model inspired by biological neural networks (e.g., animal brain and central nervous systems), and are used to estimate or approximate functions that can depend on a large number of inputs and that are generally unknown. These neural networks are generally presented as systems of interconnected "neurons" as nodes that exchange messages between each other. The connections have numeric weights that are tuned, resulting in neural nets adaptive to inputs and capable of learning. An example neural network is a convolutional neural network, which is a type of feed-forward artificial neural network in which the connectivity pattern between its neurons is inspired by the organization of the animal visual cortex, whose individual neurons are arranged in such a way that the neurons respond to overlapping regions tiling the visual field.

Example Environment

Figure 1:
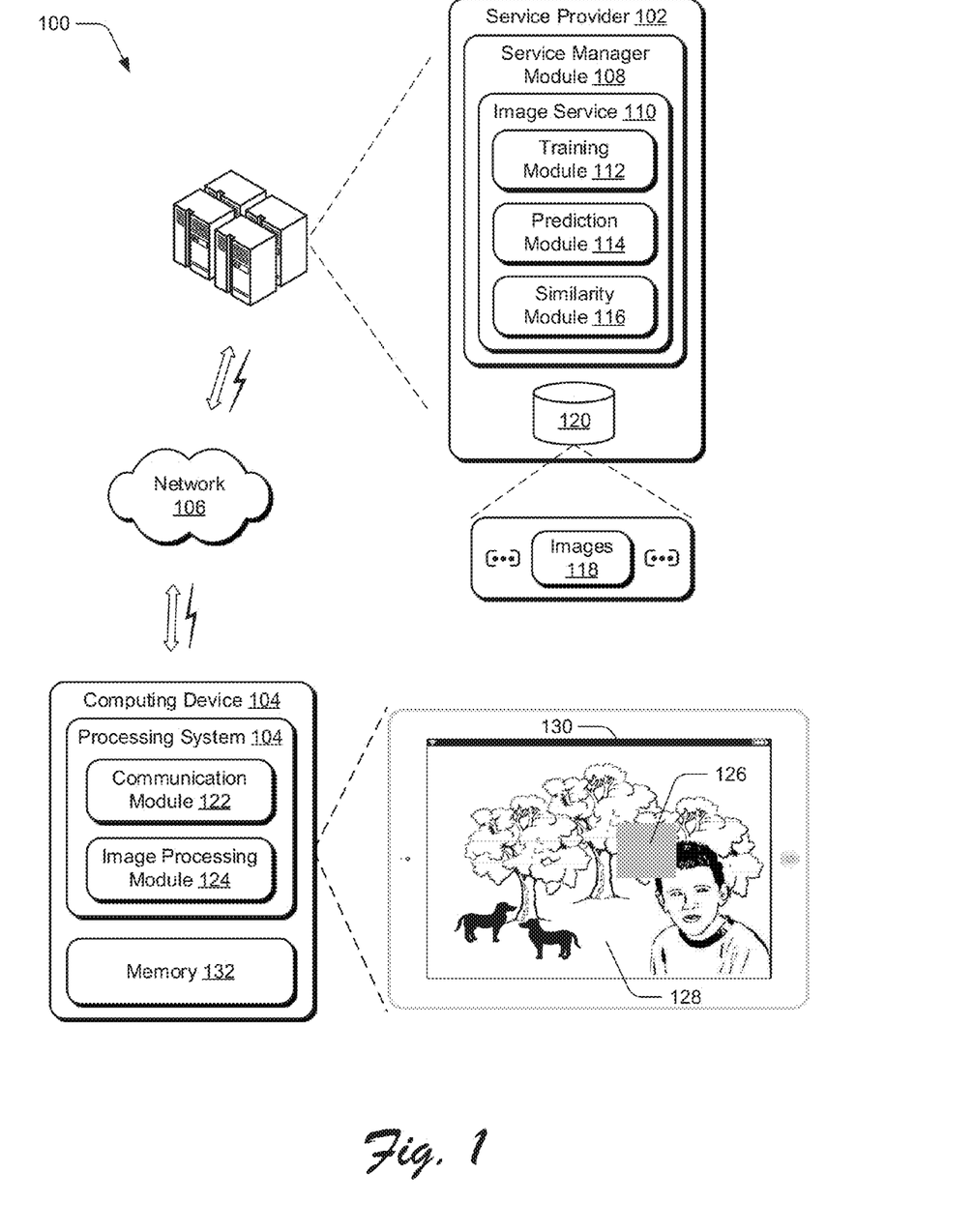
FIG. 1 illustrates an example environment in which techniques for missing region prediction can be implemented.

FIG. 1 is an illustration of an environment 100 in an example implementation that is operable to utilize techniques described herein. The illustrated environment 100 includes a service provider 102 and a computing device 104 that are communicatively coupled via a network 106. Functionality represented by the service provider 102 may be performed by a single entity, may be divided across other entities that are communicatively coupled via the network 106, or any combination thereof. Thus, the functionality represented by the service provider 102 can be performed by any of a variety of entities, including a cloud-based service, an enterprise hosted server, or any other suitable entity.

Computing devices that are used to implement the service provider 102 or the computing device 104 may be configured in a variety of ways. Computing devices, for example, may be configured as a desktop computer, a laptop computer, a mobile device (e.g., assuming a handheld configuration such as a tablet or mobile phone), and so forth. Additionally, a computing device may be representative of a plurality of different devices, such as multiple servers of the service provider 102 utilized by a business to perform operations "over the cloud" as further described in relation to FIG. 9.

Although the network 106 is illustrated as the Internet, the network may assume a wide variety of configurations. For example, the network 106 may include a wide area network (WAN), a local area network (LAN), a wireless network, a public telephone network, an intranet, and so on. Further, although a single network 106 is shown, the network 106 may be representative of multiple networks.

The service provider 102 is representative of functionality to provide one or more network-based services. The services are managed by a service manager module 108 to support a variety of different functionality. The services (e.g., web services), for instance, may be configured to support an image service 110. The image service 110 is configured to provide image editing functionality such as, for example, missing region prediction and image restoration.

The image service 110 is illustrated as including a training module 112, a prediction module 114, and a similarity module 116. The training module 112 is representative of functionality to build and train a model, such as a fully convolutional neural network (FCNN), based on multiple unrelated images 118 stored in storage 120. For instance, the training module 112 is configured to train the model using machine learning over a plurality of image pairs, where each image pair includes an original image and a corrupted version of the original image having a region of missing content. Given a large collection of images 118 for training data, the model can be trained to identify content in the region of missing content and restore the corrupted image to the original image as much as possible.

The prediction module 114 is representative of functionality to predict raw initialization values for pixels within a missing region of an image. In implementations, the prediction module 114 can utilize the model trained by the training module 112 as a basis of form the predicted raw initialization values. The raw initialization values can then be used to enhance results of a content aware fill or other image restoration operation.

In addition, the similarity module 116 is representative of functionality to identify visual similarities between a missing region and remaining regions in an image. In implementations, these similarities are learned through training the model. The training is performed by using the corrupted image as input and the similarity of the missing region and the remaining regions of the image as output. When given a new image having a missing region, the trained model is applied to identify areas of content in the new image that are similar to predicted content in the missing region of the new image. These areas can be used as patches of content with which to fill or "patch" the missing region. Further discussion of these and other aspects are provided below in more detail.

Although the storage 120 is illustrated as a component of the service provider 102, the storage 120 may alternatively be remote from the service provider 102, or may be a third-party database. The storage 120 may be a single database, or may be multiple databases, at least some of which include distributed data. Thus, a variety of different types of storage mechanisms can be utilized for the storage 120.

In implementations, a user interacts with a computing device 104 having a communication module 122 that is configured to support communication via the network 106, such as with the one or more services of the service provider 102. As such, the communication module 122 may be configured in a variety of ways. For example, the communication module 122 may be configured as a browser that is configured to "surf the web." The communication module 122 may also be representative of network access functionality that may be incorporated as part of an application, e.g., to provide network-based functionality as part of the application, an operating system, and so on. Thus, functionality represented by the communication module 122 may be incorporated by the computing device 104 in a variety of different ways.

As part of the communication supported by the communication module 122, one or more of the images 118 may be uploaded to the storage 120 via the network 106. The images 118 stored in the storage 120 can include images that were captured using an image capturing device of a user of the computing device 104, stock photos, user-created images, images downloaded or copied from one or more sources, and so on. In implementations, the image capturing device can include a camera that is integrated with the computing device 104, or that is separate from the computing device 104. Additionally, the communication module 122 may be configured to communicate with the image service 110 to initiate the image editing functionality for an image.

In alternative implementations, the image editing functionality can be provided by an image processing module 124 at the computing device 104. For example, the image processing module 124 can be configured to perform a variety of image editing functions, such as image restoration, healing, content aware fill, general editing tasks, and so on. In at least one implementation, the image editing module 124 can be configured to predict content within a missing region of an image, such as within missing region 126 in image 128 that is displayed via display device 130 of the computing device 104. The image editing module 124 can predict the content within the missing region using the model that is trained using machine learning on multiple images stored in a memory 132 at the computing device 104.

Example Implementation

The following discussion describes example implementations of missing region prediction that can be employed to perform various aspects of techniques discussed herein. The example implementations may be employed in the environment 100 of FIG. 1, the system 900 of FIG. 9, and/or any other suitable environment.

Figure 2:
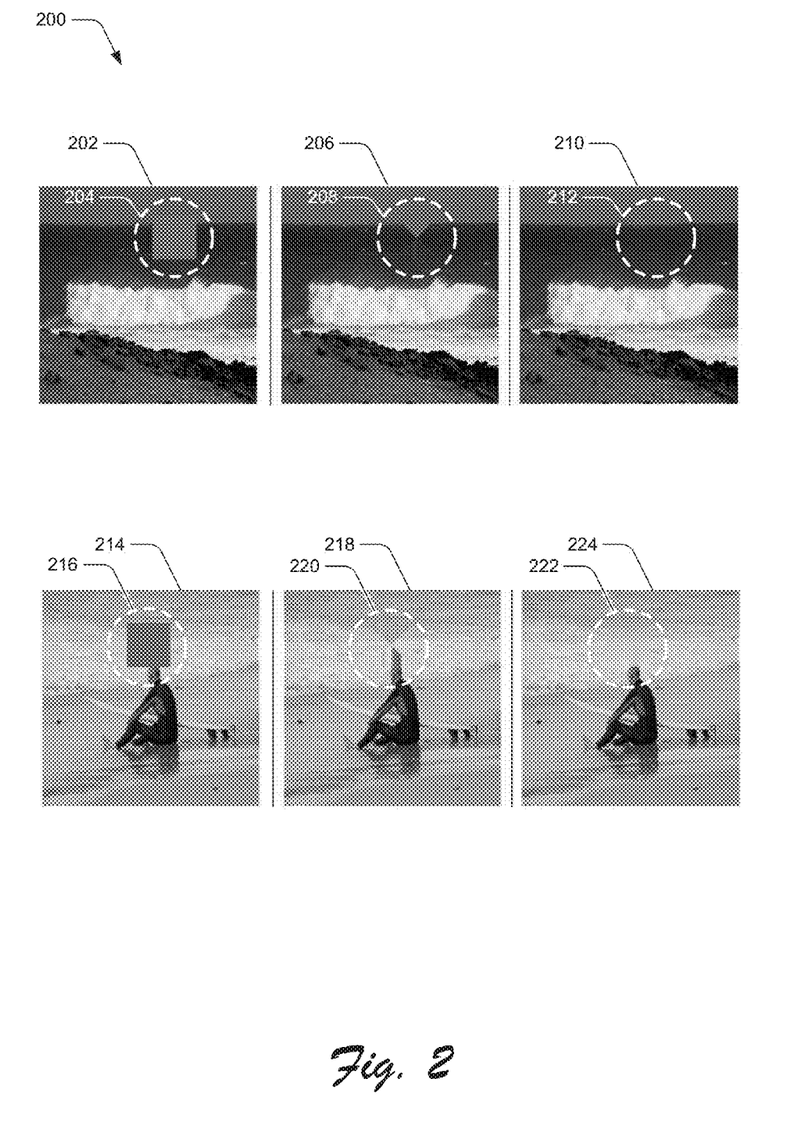
FIG. 2 is an illustration of an example illustration of an initialization output using techniques for missing region prediction compared to an initialization using conventional techniques.

FIG. 2 is an illustration of an example implementation that is operable to utilize techniques for missing region prediction. For instance, an image 202 includes a region 204 with missing content, such as incorrect pixel values illustrated as a square area. This region can also be referred to as a "hole" in the image. Conventional techniques used to predict content with which to fill in the hole utilize a nearest neighbor approach, which selects pixel values of neighboring pixels nearest to the hole as initial predicted values for the content within the hole. An example of an initialization performed by a patch matching technique is shown in image 206, which illustrates an hourglass type shape within hole 208. The patch matching technique finds dense approximate nearest-neighbor correspondences between small square regions (e.g., patches) of an image. In particular, the patch matching technique is initialized based on pixel values of nearest neighbor pixels. While these conventional techniques can be effective when the neighboring pixel values are uniform, non-uniform neighboring pixel values, however, can introduce visual errors and incorrect content into the initialization.

In contrast to conventional techniques, missing region prediction as described herein utilizes a machine-learned model to predict initialization pixel values for the pixels within the hole. An example of an initialization performed using the model described herein is shown in image 210, where initial pixel values have been predicted for pixels within hole 212. The initialization shown in image 210 appears as a low resolution prediction of content that is not based on neighboring pixel values, but is instead based on the model.

A second example contrast between the conventional techniques and the techniques described herein for missing region prediction is illustrated using image 214, which shows a surfer sitting on a beach. Notice that image 214 includes a region 216 that is missing content. Image 218 shows an example initialization 220 using conventional techniques to predict content with which to fill in the region of missing content. In image 218, the initialization 220 of the pixels in the region of missing content include visual errors by relying on pixel values associated with the surfer's head. In contrast, the techniques described herein generate an initialization 222 as illustrated in image 224, which shows a low resolution initial prediction of pixel values within the region of missing content that is visibly more accurate than the initialization 220 of the conventional techniques.

Using the techniques described herein provide improved initialization values for pixels within a missing region, thereby reducing visual errors inherent in conventional techniques. These improved techniques are particularly useful when the neighboring pixels around the hole are non-uniform. Further discussion of example implementations of missing region prediction is described with reference to FIGS. 3-6.

Figure 3:
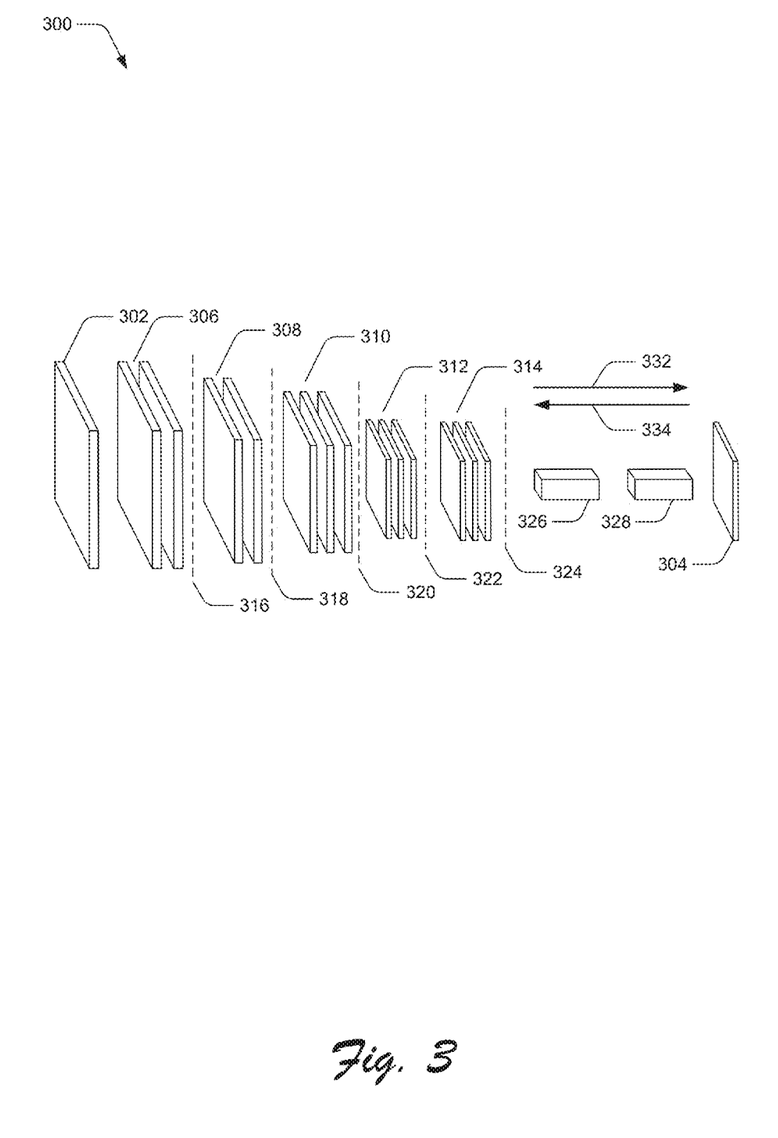
FIG. 3 illustrates an example model that is operable to utilize techniques for missing region prediction.

FIG. 3 illustrates an example model 300 that is operable to utilize techniques for missing region prediction. The example model 300 includes a network architecture representing a neural network, such as a fully convolutional neural network (FCNN), that is usable to perform pixel-wise end-to-end learning and inference of missing contents in an image without relying on nearest neighbor information. In applications, such as content-aware fill, a key component is identifying visually similar regions in the image with a missing region, and then generating a coarse prediction for content within the missing region. As previously mentioned, simply padding a missing region with nearby pixels, as performed by conventional techniques, may introduce visible errors in an initial prediction that cannot be corrected using the conventional techniques.

The model 300 architecture is usable, however, to learn to predict the content of the missing region given a corrupted image. For instance, the model 300 can be trained using machine learning on pairs of images, where each pair includes an original image and a corrupted image corresponding to the original image. In implementations, the corrupted image is a substantial copy of the original image but with a region of missing content. The corrupted image can be generated based on removing a random region of content from the image, such as by setting pixel values of pixels within the region to zero. Alternatively, the pixel values of the pixels within the region can be set to any suitable uniform value to remove corresponding content from that particular region of the image, such as by setting the pixel values to a mean value of the image, an averaged mean value of RGB images, and so on. The model can then be trained using machine learning on the image pairs to identify the content within the missing region and substantially restore the corrupted image to the original image. In implementations, the model can encode image semantics and structural information, such as a location of the missing region and its nearby contents.

In implementations, the machine learning uses the corrupted image as input and the original image as output. Associating the output with the missing region in the input is not trivial, however. Accordingly, the techniques described herein use the corrupted image as the input, and the original image in its entirety as the output. This allows a natural pixel-wise associated to be maintained while training the model 300.

The model 300 can be formed by a stack of distinct layers that transform an input volume (e.g., input image 302) into an output volume (e.g., output image 304) through a differentiable function. In implementations, the input image 302 can be a portion of the corrupted image of the image pair. The portion can include any suitable size or resolution. In the illustrated example, the structure of the input image 302 is a 306×306 color image. The input image 302 can then pass through the stack of layers, which can include a variety of different numbers and types of layers. In the illustrated implementation, the model 300 includes five convolutional layers, two fully convolutional layers, and five pooling layers.

Convolutional layers, such as layers 306-314, are the core building block of a convolutional neural network. Layers 306-314 include learnable filters (e.g., kernels), which have a small receptive field but extend through a full depth of the input image 302. During a forward pass, each filter is convolved across the width and height of the input volume, computing a dot product between the entries of the filter and the input, and producing a 2-dimensional activation map of that filter. As a result, the model learns filters that activate when they encounter some specific type of feature at some spatial position in the input. Stacking the activation maps for all filters along the depth dimension forms the full output volume of the convolution layer. Every entry in the output volume can thus also be interpreted as an output of a neuron that looks at a small region in the input and shares parameters with neurons in the same activation map. In addition, by enforcing a local connectivity pattern between neurons of adjacent layers (e.g., each neuron is connected to only a small region of the input image 302), the model 300 can exploit spatially local correlations. This connectivity can be referred to as a receptive field of the neuron.

Some hyperparameters can be used to control a size of an output volume of the convolutional layer, examples of which include depth, stride, and zero-padding. The depth of the output volume controls a number of neurons in the layer that connect to the same region of the input volume. These neurons are configured to learn to activate for different features in the input volume. For example, if the first convolutional layer 306 takes a raw image as input, then different neurons along the depth dimension may activate in the presence of various oriented edges, or blobs of color.

The stride controls how depth columns around the spatial dimensions (width and height) are allocated. For example, when the stride is set to one, a new depth column of neurons is allocated to spatial positions only one spatial unit apart. This can lead to heavily overlapping receptive fields between columns, and also to large output volumes. Conversely, if higher strides are used, then the receptive fields may overlap less and the resulting output volume may be smaller dimensions spatially. Zero-padding refers to padding the input volume with zeros along a border of the input volume. Zero-padding allows control of the spatial size of the output volumes. For example, the spatial size of the input volume may be exactly preserved by using zero-padding.

The pooling layers, such as layers 316-324, enable non-linear down-sampling. For example, pooling can partition the input image 302 into a set of non-overlapping sub-regions, and output a maximum for each sub-region. Accordingly, the function of the pooling layer is to progressively reduce the spatial size of the representation to reduce the amount of parameters and computation in the network, and also control overfitting. In the model 300, pooling layers are positioned between successive convolutional layers. Further, the last two pooling layers (e.g., pooling layers 320 and 322) have a stride set to one, which allows the pooling layers to filter pixel-by-pixel.

Fully convolutional layers, such as layers 326 and 328, do not change the spatial resolution of the input. Rather, the fully convolutional layers 326 and 328 include 1×1 filters across all dimensions (e.g., depth, stride, and zero-padding).

In at least one example, the input image 302 can pass through convolutional layer 306 and pooling layer 316 as a 306×306 color image, through convolutional layer 308 and pooling layer 318 as a 154×154 color image, through convolutional layer 310 and pooling layer 320 as a 78×78 color image, and through each of convolutional layers 310 and 312 and pooling layers 322 and 324 as a 40×40 color image. After passing through pooling layer 324, the input image 302 can pass through fully convolutional layers 326 and 328 to generate a prediction for the output image 304 in a 40×40 matrix, which is converted into a 40×40 color image. Here, the output image 304 represents a raw prediction for the input image 302. Further, because the corrupted image is used as input to the model, and the original image is used as the output of the model, both forward inference 322 and backward learning 324 can be utilized to generate the raw prediction.

Advantages of this network architecture include an ability to learn and generate pixel-wise prediction, based on the network architecture encoding structural information of the entire image. Also, this network architecture incorporates semantic information as the network training is initialized. Additionally, by setting the stride of the last two pooling layers to one and inserting zeros into filters, a relatively large-size output is provided.

In the model training, a Euclidian loss is used, which is based on the following equation:

$$E(x,y)=\Sigma_p(x_p-y_p)^2 \qquad \text{Equation 1}$$

In Equation 1, the term y represents the corrupted image, and the term x refers to the original image. In addition, the term $x_p$ refers to pixels in the original image x, while the term $y_p$ refers to pixels in the corrupted image y. Example prediction results are shown in FIG. 4.

Figure 4:
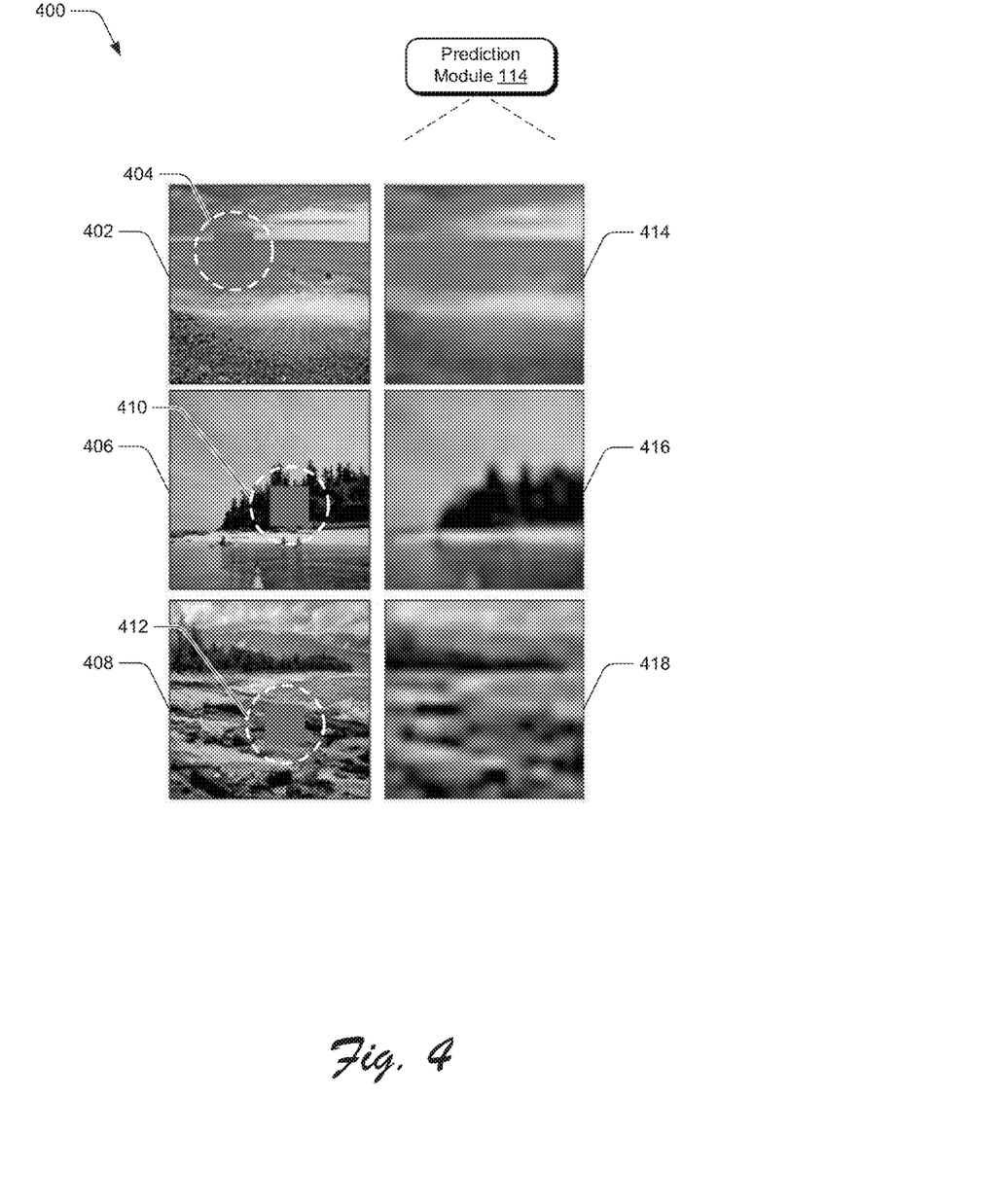
FIG. 4 illustrates an example environment in which techniques for missing region prediction can be implemented.

FIG. 4 illustrates an example implementation 400 that is usable to implement techniques for missing region prediction. In the illustrated example, image 402 includes a missing region 404. The missing region 404 is an area in the image 402 that is missing image content, and is represented by a square shape of grey pixels. Images 406 and 408 also include missing regions, such as missing regions 410 and 412, that are missing content denoted by grey pixels. Using a trained model, prediction results for the images 404-408 are shown as lower resolution versions of the images 404-408. For example, prediction 414 is a prediction of image content corresponding to image 404 using the model. Notice that the missing region 404 is no longer missing in the prediction 414, but has been filled with predicted pixel values. This prediction 414 can then be used as initialization pixel values for an image restoration operation, such as content aware fill, to refine the image content inside the missing region 404. In the illustrated example, prediction 416 represents predicted image content corresponding to image 406 and missing region 410, and prediction 418 represents predicted image content corresponding to image 408 and missing region 412.

Figure 5:
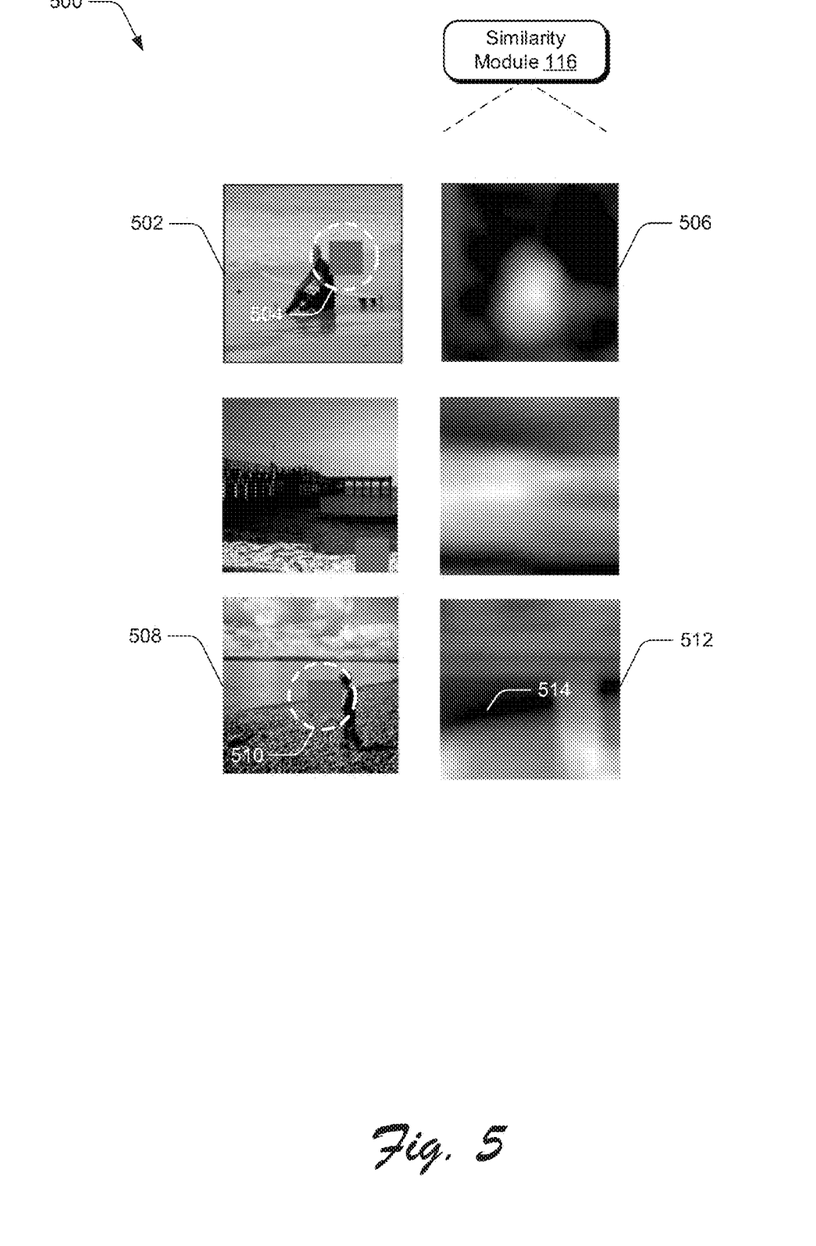
FIG. 5 illustrates an example environment in which techniques for missing region prediction can be implemented.

FIG. 5 illustrates an example implementation 500 that is usable to employ missing region prediction. The example implementation 500 represents a similarity learning and inference approach to identify visual similarities between a missing region of an image and remaining regions of the image. These visual similarities can be learned through training a model using machine learning, as described above. However, in this approach the corrupted image is used as input while the similarity of the missing region with the remaining regions of the image is used as output. Then, when given a new image with a missing region, the trained model can be applied to identify regions within the new image that are similar to the missing region in the new image.

In the similarity learning and inference approach, distance maps are generated as labels to train the model. A distance map describes similarities between the missing region and the remaining regions of the image. In implementations, the distance map can be generated using Euclidean distance in a LAB color space. Example distance maps are illustrated in FIG. 5. For example, image 502 includes a missing region 504. Using a trained model, a distance map 506 is generated to identify visual similarities between predicted content for the missing region and remaining regions in the image 502. In the distance map 506, each pixel represents the similarity between a region centered at that pixel and the missing region in the input. Relatively darker pixels in the distance map represent higher similarity, while lighter pixels represent lower similarity. In addition, the distance map 506 and the image 502 are the same size, but the distance map 506 has a relatively lower resolution than the image 502.

In another example, image 508 includes a missing region 510, which is located along a shoreline. Using the techniques described herein, a distance map 512 is generated to identify other regions within the image 508 that are similar to content that should be in the missing region 508. In the distance map 512, dark pixels 514 can be seen that, when compared to image 508, appear to be along the shoreline. This indicates that these other regions in the image 508 include content that is similar to content that should be within the missing region 510, and thus may be good candidates to use to patch the missing region. The key to generating a distance map that correctly identifies similar regions to the missing region is reliance on the trained model. Without the trained model, distance maps may be based on incorrect initialization values, as described above, which can result in visual errors in a final prediction for the missing region.

Example Procedures

The following discussion describes techniques for missing region prediction that may be implemented utilizing the previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to the environment 100 of FIG. 1.

Figure 6:
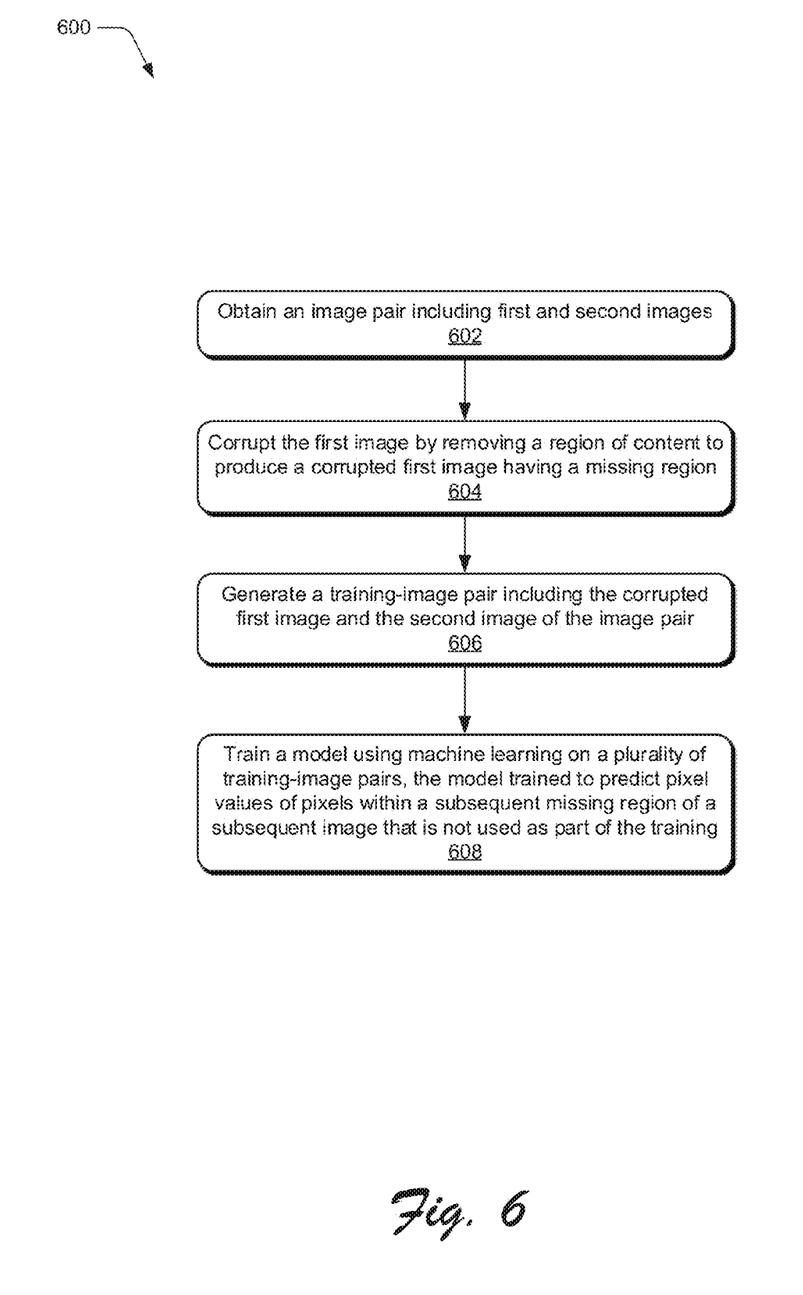
FIG. 6 is a flow diagram depicting a procedure in an example implementation in which techniques for missing region prediction are utilized.

FIG. 6 is a flow diagram depicting a procedure 600 in an example implementation in which techniques for missing region prediction are utilized. In implementations, an image pair is obtained that includes first and second images (block 602). The first image is corrupted by removing a region of content to produce a corrupted first image having a missing region (block 604). This step can be performed in any suitable way. For example, a region in the first image can be randomly selected, and pixels within that region can be set to zero or other uniform value. Doing so removes the visual content portrayed by the pixels in the selected region. Alternatively, the second image can be corrupted and the first image can remain uncorrupted.

Using the corrupted image and the second image, a training-image pair is generated (block 606). Then, a model is trained using machine learning on a plurality of training-image pairs (block 608). In implementations, the model is trained to predict pixel values of pixels within a subsequent missing region of a subsequent image that is not used as part of the training. As described above, the model can include a fully convolutional neural network. In at least one implementation, the training-image pairs can include pairs of images that are unrelated to the subsequent image.

Figure 7:
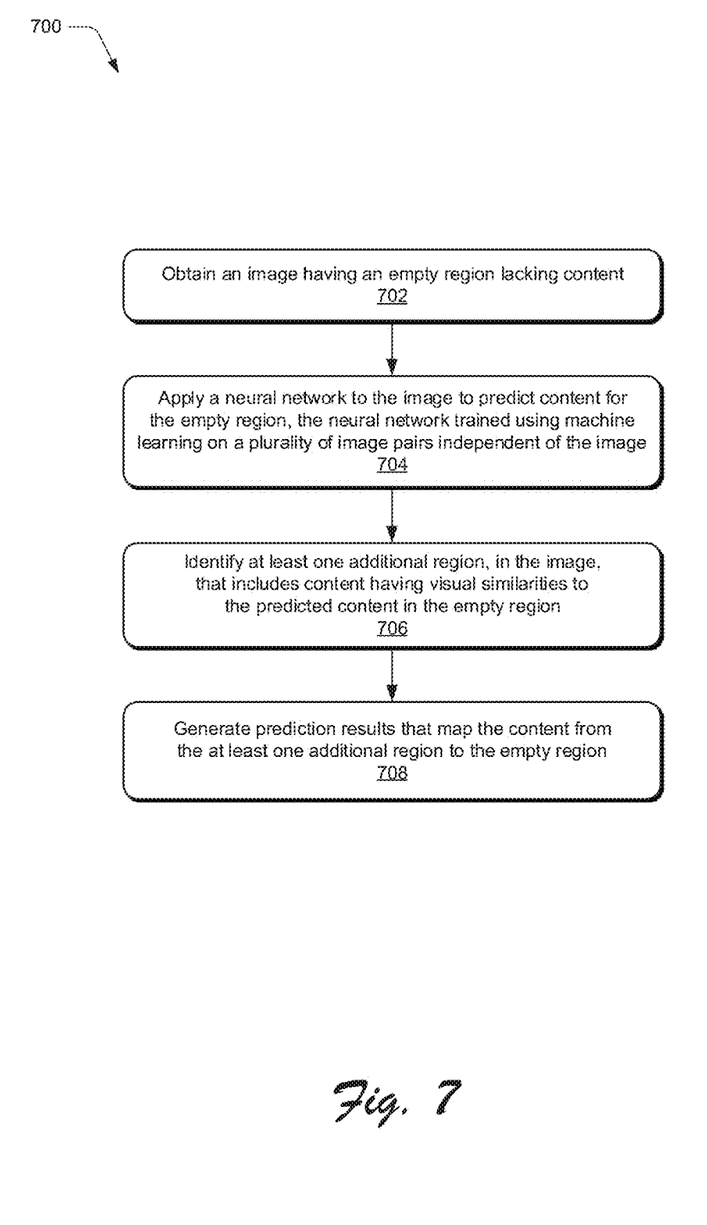
FIG. 7 is a flow diagram depicting a procedure in an example implementation in which techniques for missing region prediction are utilized.

FIG. 7 is a flow diagram depicting a procedure 700 in an example implementation in which techniques for missing region prediction are utilized. An image having an empty region lacking content is obtained (block 702). Then, a neural network is applied to the image to predict content for the empty region (block 704). In at least one implementation, the neural network is trained using machine learning on a plurality of image pairs independent of the image. Once the neural network has been applied to the image, at least one additional region in the image is identified that includes content having visual similarities to the predicted content in the empty region (block 706). For instance, a distance map can be generated and utilized to identify other regions in the image that have content likely to be similar to the content missing from the empty region. Content from these other regions may be used to patch the empty region, if the content is substantially similar. Prediction results are generated that map the content from the identified region to the empty region (block 708). These prediction results can subsequently be used as raw initialization values for a fill operation, such as content aware fill, healing, image restoration, and so on.

Example System and Device

Figure 8:
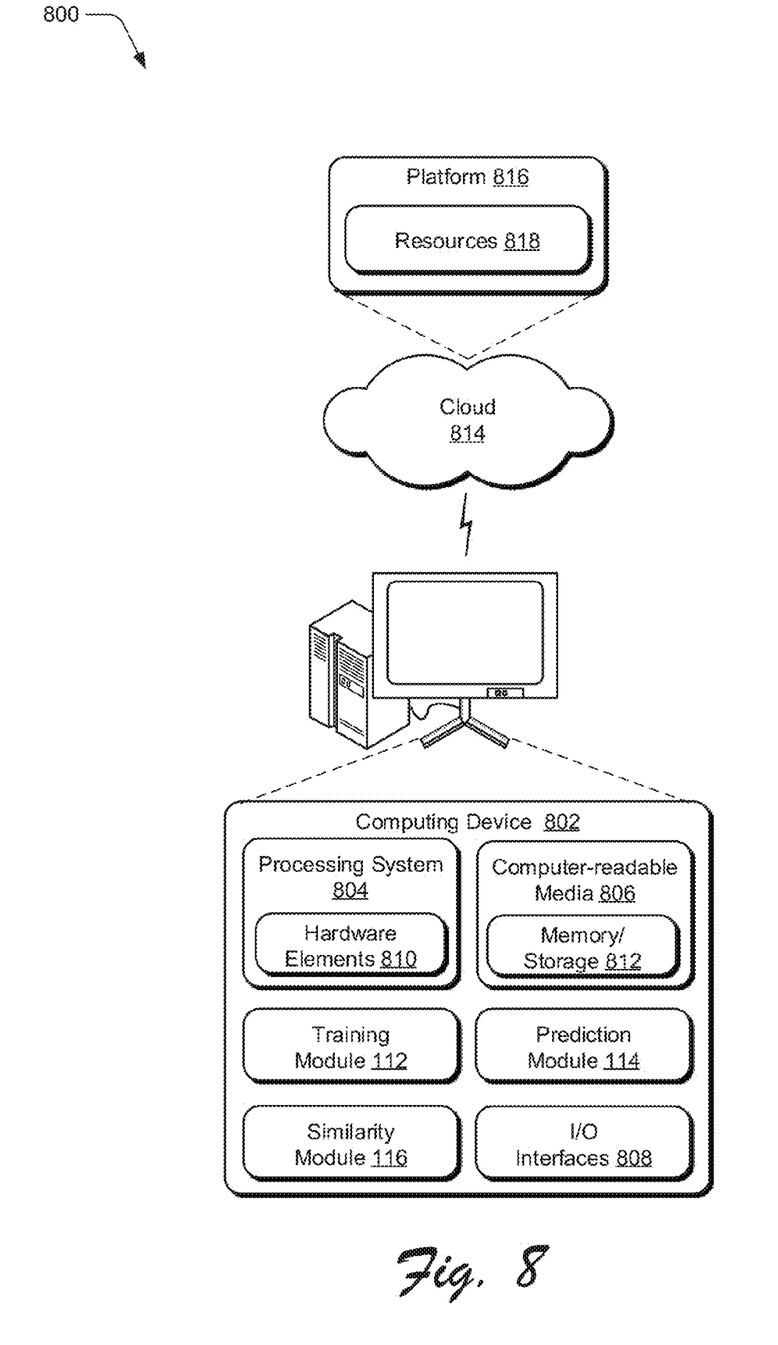
FIG. 8 illustrates various components of an example device that can be implemented as any type of computing device as described herein to implement the techniques described herein.

FIG. 8 illustrates an example system generally at 800 that includes an example computing device 802 that is representative of one or more computing systems and/or devices that may implement the various techniques described herein. This is illustrated through inclusion of training module 112, the prediction module 114, and similarity module 116. The training module 112 may be configured to train a model, using machine learning over a plurality of image pairs, to predict content in a missing region of missing content in an image. The prediction module 114 may be configured to predict raw initialization values for pixels within a missing region of an image. Additionally, the similarity module 116 may be configured to identify visual similarities between a missing region and remaining regions in an image by utilizing the model trained by the training module 112. The computing device 802 may be, for example, a server of a service provider, a device associated with a client (e.g., a client device), an on-chip system, and/or any other suitable computing device or computing system.

The example computing device 802 as illustrated includes a processing system 804, one or more computer-readable media 806, and one or more I/O interface 808 that are communicatively coupled, one to another. Although not shown, the computing device 802 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 804 is representative of functionality to perform one or more operations using hardware. Accordingly, the processing system 804 is illustrated as including hardware element 810 that may be configured as processors, functional blocks, and so forth. This may include implementation in hardware as an application specific integrated circuit or other logic device formed using one or more semiconductors. The hardware elements 810 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 806 is illustrated as including memory/storage 812. The memory/storage 812 represents memory/storage capacity associated with one or more computer-readable media. The memory/storage component 812 may include volatile media (such as random access memory (RAM)) and/or nonvolatile media (such as read only memory (ROM), Flash memory, optical disks, magnetic disks, and so forth). The memory/storage component 812 may include fixed media (e.g., RAM, ROM, a fixed hard drive, and so on) as well as removable media (e.g., Flash memory, a removable hard drive, an optical disc, and so forth). The computer-readable media 806 may be configured in a variety of other ways as further described below.

Input/output interface(s) 808 are representative of functionality to allow a user to enter commands and information to computing device 802, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 802 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 802. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 802, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 810 and computer-readable media 806 are representative of modules, programmable device logic and/or fixed device logic implemented in a hardware form that may be employed in some implementations to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 810. The computing device 802 may be configured to implement particular instructions and/or functions corresponding to the software and/or hardware modules. Accordingly, implementation of a module that is executable by the computing device 802 as software may be achieved at least partially in hardware, e.g., through use of computer-readable storage media and/or hardware elements 810 of the processing system 804. The instructions and/or functions may be executable/operable by one or more articles of manufacture (for example, one or more computing devices 802 and/or processing systems 804) to implement techniques, modules, and examples described herein.

The techniques described herein may be supported by various configurations of the computing device 802 and are not limited to the specific examples of the techniques described herein. This functionality may also be implemented all or in part through use of a distributed system, such as over a "cloud" 814 via a platform 816 as described below.

Cloud 814 includes and/or is representative of a platform 816 for resources 818. Platform 816 abstracts underlying functionality of hardware (e.g., servers) and software resources of the cloud 814. Resources 818 may include applications and/or data that can be utilized while computer processing is executed on servers that are remote from the computing device 802. Resources 818 can also include services 820 provided over the Internet and/or through a subscriber network, such as a cellular or Wi-Fi network.

Platform 816 may abstract resources and functions to connect computing device 802 with other computing devices. Platform 816 may also serve to abstract scaling of resources to provide a corresponding level of scale to encountered demand for resources 818 that are implemented via platform 816. Accordingly, in an interconnected device implementation, implementation of functionality described herein may be distributed throughout system 800. For example, the functionality may be implemented in part on computing device 802 as well as via platform 816 that abstracts the functionality of cloud 814.

Conclusion

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. In a digital medium environment to predict pixel values of a missing region in an image, a method implemented by at least one computing device, the method comprising:
   obtaining, by the at least one computing device, an image pair including first and second images;
   corrupting, by the at least one computing device, the first image by removing a region of content to produce a corrupted first image having a missing region;
   generating, by the at least one computing device, a training-image pair including the corrupted first image and the second image of the image pair; and
   training, by the at least one computing device, a model using machine learning on a plurality of training-image pairs including the training-image pair, the model trained to predict pixel values of pixels within a subsequent missing region of a subsequent image that is not used as part of the training.

2. A method as recited in claim 1, wherein the missing region is surrounded by non-uniform content.

3. A method as recited in claim 1, wherein the region is removed by setting pixel values of pixels within the missing region to zero.

4. A method as recited in claim 1, wherein the machine learning uses a neural network.

5. A method as recited in claim 1, wherein the machine learning includes end-to-end and pixel-to-pixel learning on the plurality of training-image pairs to train the model without relying on nearest neighbor information.

6. A method as recited in claim 1, wherein the training is performed by using the corrupted first image as an input and the second image as an output.

7. A method as recited in claim 1, wherein the training includes configuring the model to encode image semantics and structural information associated with at least one of the corrupted first image or the second image.

8. A method as recited in claim 1, further comprising controlling a content aware fill operation using the predicted pixel values as initialization values.

9. In a digital medium environment to predict pixel values of a missing region in an image, a method implemented by at least one processor, the method comprising:
   obtaining a plurality of image pairs, each image pair including an original image and a corrupted image that is a corrupted version of the original image, the corrupted image having at least one region of missing content;
   training, by the at least one processor, a model using pixel-wise end-to-end machine learning on the plurality of images pairs based on the corrupted image as input and the original image as output, the model trained to identify content corresponding to the missing content and restore the corrupted image to the original image; and
   generating, based on the model, initial predicted pixel values corresponding to pixels within a subsequent missing region of a subsequent corrupted image that is independent of the plurality of image pairs.

10. A method as recited in claim 9, further comprising corrupting the corrupted image in respective image pairs of the plurality of image pairs by removing content from the at least one region.

11. A method as recited in claim 10, wherein the at least one region is removed by setting pixel values of pixels within the region to zero.

12. A method as recited in claim 9, further comprising using the initial predicted pixel values as initialization values for a content aware fill operation.

13. A method as recited in claim 9, further comprising configuring the model to encode image semantics and structural information associated with at least one of the corrupted image or the original image.

14. A method as recited in claim 9, wherein the model comprises a fully convolutional neural network.

15. In a digital medium environment to predict content of a missing region in an image to enhance results of a content aware fill operation, a system comprising:
  at least one processor; and
  at least one computer-readable storage media storing instructions that are executable by the at least one processor to implement a similarity module configured to:
    obtain an image having an empty region lacking content;
    apply a neural network to the image to predict content for the empty region, the neural network trained using machine learning on a plurality of image pairs independent of the image, each said image pair having an original image and a corrupted image that is a corrupted version of the original image;
    identify at least one additional region, in the image, that includes content having visual similarities to the predicted content in the empty region; and
    generate prediction results that map the content from the at least one additional region to the empty region.

16. A system as recited in claim 15, wherein the content from the at least one additional region is used to patch the empty region.

17. A system as recited in claim 15, wherein:
  the similarity module is further configured to generate a distance map for each said image pair to train the neural network; and
  the distance map describes visual similarities between a missing region in the corrupted image and remaining regions in the corrupted image.

18. A system as recited in claim 17, wherein the distance map includes pixels that each represent a similarity between an area centered at the pixel and the missing region in the corrupted image.

19. A system as recited in claim 15, wherein the region and the at least one additional region are a same size.

20. A system as recited in claim 15, wherein the model comprises a fully convolutional neural network.

* * * * *